United States Patent
Haley et al.

(10) Patent No.: US 12,022,633 B2
(45) Date of Patent: Jun. 25, 2024

(54) BLOWER DESIGN FOR A GRAPHICS PROCESSING UNIT

(71) Applicant: NVIDIA CORPORATION, Santa Clara, CA (US)

(72) Inventors: David Haley, Beaverton, OR (US); Xiang Sun, Los Gatos, CA (US); Gabriele Gorla, Santa Clara, CA (US); Andrew Bell, San Francisco, CA (US); Boris Landwehr, Thousand Oaks, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/011,437

(22) Filed: Sep. 3, 2020

(65) Prior Publication Data

US 2021/0298199 A1  Sep. 23, 2021

Related U.S. Application Data

(60) Provisional application No. 62/991,055, filed on Mar. 17, 2020.

(51) Int. Cl.
*H05K 7/20* (2006.01)
*G06F 1/20* (2006.01)

(52) U.S. Cl.
CPC ........... *H05K 7/20145* (2013.01); *G06F 1/20* (2013.01); *H05K 7/20163* (2013.01); *H05K 7/20172* (2013.01)

(58) Field of Classification Search
CPC ......... G06F 1/20; G06F 1/203; H01L 23/467; H05K 7/20136; H05K 7/20154; H05K 7/20172; H05K 7/20163; H05K 7/20145
See application file for complete search history.

(56) References Cited

U.S. PATENT DOCUMENTS 6,069,792 A * 5/2000 Nelik ........................ G06F 1/20
  361/679.48
6,472,781 B2 * 10/2002 Yamamoto ............ F04D 29/424
  310/58

(Continued)

FOREIGN PATENT DOCUMENTS

CN  105723296 A * 6/2016  ......... H05K 7/20145

OTHER PUBLICATIONS

Kruse, T, "Ventilation Device", Jun. 29, 2016, Entire Document (translation of CN 105723296) (Year: 2016).*

*Primary Examiner* — Stephen S Sul
(74) *Attorney, Agent, or Firm* — Artegis Law Group, LLP

(57) ABSTRACT

A graphics subsystem includes a printed circuit board (PCB), a blower, and a heat sink. A graphics processing unit (GPU) is integrated into the PCB. The PCB is shortened to occupy a portion of the width of the graphics subsystem. The heat sink is coupled to the PCB and/or GPU similarly occupies just a portion of the width of the graphics subsystem. The blower is disposed adjacent to the PCB and heat sink and configured to occupy the full height of the graphics subsystem. The blower is further configured to intake air from both the top side of the graphics subsystem and the bottom side of the graphics subsystem. In this configuration, the blower provides an elevated air flow rate in order to facilitate cooling of the PCB and/or GPU.

16 Claims, 6 Drawing Sheets

(56) References Cited

U.S. PATENT DOCUMENTS

| | | | |
|---|---|---|---|
| 7,486,519 B2* | 2/2009 | Loiler | G06F 1/20 361/720 |
| 8,405,976 B2* | 3/2013 | Liu | G11B 33/142 361/679.49 |
| 8,517,675 B2* | 8/2013 | Stanley | F03D 3/06 165/185 |
| 9,936,577 B1* | 4/2018 | Hu | H05K 1/11 |
| 2003/0042003 A1* | 3/2003 | Novotny | H05K 7/20172 165/47 |
| 2003/0042004 A1* | 3/2003 | Novotny | G06F 1/20 165/80.2 |
| 2004/0079520 A1* | 4/2004 | Lee | H01L 23/467 165/122 |
| 2005/0061477 A1* | 3/2005 | Mira | H01L 23/467 257/E23.099 |
| 2007/0047211 A1* | 3/2007 | Refai-Ahmed | H01L 23/4093 361/720 |
| 2007/0121289 A1* | 5/2007 | Peng | G06F 1/20 257/E23.099 |
| 2010/0238628 A1* | 9/2010 | Hung | G06F 1/183 361/688 |
| 2014/0016268 A1* | 1/2014 | Tsujimura | H05K 7/20727 361/695 |
| 2014/0071624 A1* | 3/2014 | Aoki | H05K 7/20263 361/699 |
| 2014/0376170 A1* | 12/2014 | Richard | G06F 1/203 361/679.32 |
| 2017/0115704 A1* | 4/2017 | Ent | G06F 1/185 |
| 2018/0284852 A1* | 10/2018 | Rannow | H01L 23/473 |
| 2019/0227605 A1* | 7/2019 | Wiltzius | G06F 1/186 |
| 2020/0236813 A1* | 7/2020 | Shearman | H05K 7/1411 |
| 2021/0203891 A1* | 7/2021 | Kawase | G03B 21/16 |

* cited by examiner

BLOWER DESIGN FOR A GRAPHICS PROCESSING UNIT

CROSS-REFERENCE TO RELATED APPLICATIONS

This application claims the priority benefit of United States provisional patent application titled, "Blower Design for a Graphics Processing Unit," filed on Mar. 17, 2020 and having Ser. No. 62/991,055. The subject matter of this related application is hereby incorporated herein by reference.

BACKGROUND

Field of the Various Embodiments

Conventional computer systems typically include at least one central processing unit (CPU) and at least one graphics processing unit (GPU). The CPU executes various types of software applications, while the GPU performs graphics processing operations on behalf of the CPU. Certain types of computer systems may include a GPU that is integrated onto a motherboard where the CPU resides; whereas, other types of computer systems may include a GPU that resides within a graphics subsystem that is coupled to the motherboard via a peripheral component interface express (PCIe) slot.

A conventional graphics subsystem usually includes a printed circuit board (PCB) where the GPU resides, at least one fan, and a heat sink. The GPU is normally integrated into the PCB and electronically coupled to various other electronic components. The heat sink is thermally coupled to the GPU and/or the PCB and includes a set of cooling fins. The fan is typically disposed proximate to the heat sink and configured to direct airflow towards the cooling fins.

During operation, the GPU generates heat that needs to be dissipated in order to prevent overheating. In that regard, the heat sink is configured to extract heat generated by the GPU and to dissipate that heat into the general environment via the cooling fins. The fan simultaneously circulates air across the cooling fins in order to provide a convective cooling effect that increases the rate of heat dissipation. In this manner, the heat sink and the fan interoperate to cool the GPU and keep the operating temperature of the GPU within a specified range.

As a general matter, GPUs that operate at higher frequencies generate more heat than GPUs that operate at lower frequencies. Accordingly, a GPU subsystem that includes a GPU operating at a higher frequency needs more effective cooling to prevent overheating. One approach to providing more effective cooling to GPUs is to implement a larger fan that increases the rate of air circulation across the cooling fins of the heat sink. However, this approach has limited applicability because the PCIe slot where the graphics subsystem resides has a specific form factor that cannot physically accommodate fans that are larger than a particular size. Consequently, conventional graphics subsystems typically cannot be equipped with GPUs that operate at relatively higher frequencies.

As the foregoing illustrates, what is needed in the art are more effective approaches to cooling GPUs within graphics subsystems.

SUMMARY

Various embodiments include a system, including a printed circuit board on which a processor resides, and a blower that is coupled to the printed circuit board such that at least a portion of the blower abuts a first edge of the printed circuit board, and a first airflow path for cooling the processor is redirected through the blower and across the printed circuit board.

At least one technological advantage of the disclosed design relative to the prior art is that the disclosed design enables graphics subsystems to be equipped with higher performance GPUs relative to the GPUs typically included in conventional graphics subsystems.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

As noted above, a GPU subsystem that includes a GPU operating at a high frequency needs more effective cooling to prevent overheating. A larger fan can provide more effective cooling by increasing the rate of air circulation across the cooling fins. However, the PCIe slot where the graphics subsystem resides has a specific form factor that typically cannot physically accommodate a fan that is larger than a particular size. Consequently, conventional graphics subsystems usually can only be equipped with GPUs that operate at lower frequencies.

To address these issues, various embodiments include a graphics subsystem that includes a PCB, a blower, and a heat sink. A GPU is integrated into the PCB. The PCB is shortened to occupy a smaller portion of the width of the graphics subsystem compared to the PCB within a conventional graphics subsystem. The heat sink is coupled to the PCB and/or the GPU and is configured to occupy a similarly smaller portion of the width of the graphics subsystem as the PCB.

The blower is disposed adjacent to one edge of the PCB and/or heat sink and extends axially between the top of the graphics subsystem and the bottom of the graphics subsystem. The blower includes a first inlet that intakes air from the top side of the graphics subsystem and then redirects that air across the PCB and/or heat sink towards an outlet disposed on one side of the graphics subsystem. The blower also includes a second inlet that intakes air from the bottom side of the graphics subsystem and then redirects that air across the PCB and/or heat sink towards the outlet. Because the PCB and heat sink do not occupy the entire width of the graphics subsystem, the blower can be sized to occupy a vertical span that extends the full height of the graphics subsystem. The disclosed configuration allows the blower to intake air from both the top and bottom sides of the graphics subsystem, thereby increasing flow rate and, thus, convective cooling capabilities.

At least one technical advantage of the disclosed design relative to the prior art is that, with the disclosed design, graphics subsystems can be equipped with higher performance GPUs relative to the GPUs typically included in conventional graphics subsystems. Accordingly, the disclosed design enables higher performance GPUs to be implemented in computer systems without a substantial risk of overheating. These technical advantages represent one or more technological advancements over prior art approaches.

System Overview

Figure 1:
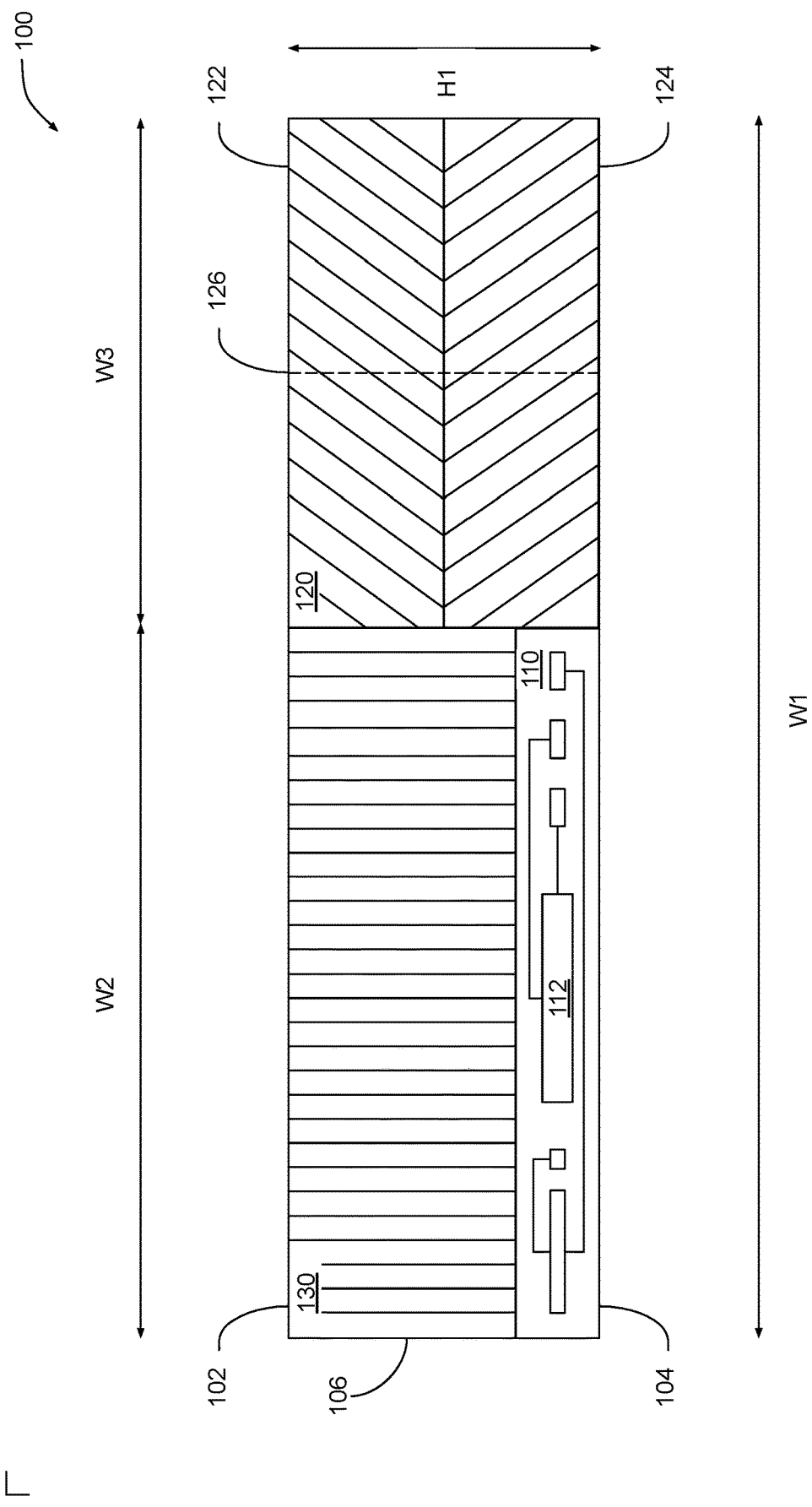
FIG. 1 illustrates a graphics subsystem configured to implement one or more aspects of the various embodiments.

FIG. 1 illustrates a graphics subsystem configured to implement one or more aspects of the various embodiments. As shown, graphics subsystem 100 includes a PCB 110, a blower 120, and a heat sink 130. PCB 110 includes a GPU 112 and various other electronic components. In one embodiment, PCB 110 may include any technically feasible type of processor in addition to, or instead of, GPU 112, such as one or more central processing units (CPUs), among other types of processors. PCB 110 and/or GPU 112 are thermally coupled to heat sink 130. Heat sink 130 resides proximate to a top side 102 of graphics subsystem 100, while PCB 110 resides proximate to a bottom side 104 of graphics subsystem 100. In various embodiments, PCB 110 and/or heat sink 130 may reside proximate to any other technically feasible side of graphics subsystem 100. PCB 110 and/or heat sink 130 reside adjacent to outlet 106. Heat sink 130 may include any technically feasible type of heat dissipation and/or heat transport mechanism, including cooling fins, heat pipes, and so forth.

Blower 120 resides adjacent to PCB 110 and heat sink 130. Blower 120 is a fan assembly that includes inlet 122 disposed proximate to top side 102 of graphics subsystem 100 and inlet 124 disposed proximate to bottom side 104 of graphics subsystem. In various embodiments, blower 120 may be configured with only one inlet. Blower 120 includes an axis 126 of rotation that is disposed substantially perpendicular to PCB 110. The term "substantially perpendicular," as referred to herein, indicates that axis 126 is disposed within a certain angular range of perpendicular relative to PCB 110. In one embodiment, at least a portion of axis 126 may be substantially parallel to at least one edge of PCB 110, where the term "substantially parallel" indicates that the portion of axis 126 is disposed within a certain angular range of parallel relative to the edge of PCB 110.

As also shown, graphics subsystem 100 has a width of approximately W1 and a height of approximately H1. PCB 110 and heat sink 130 have a width of approximately W2 and a combined height of H1. Blower 120 has a width of approximately W3 and a height of H1. PCB 110 occupies only a portion of the total width W1 of graphics subsystem 100. Graphics subsystem 100 can therefore accommodate the presence of blower 120 adjacent to PCB 110, thereby allowing blower 120 to occupy some or all of the full height H1 of graphics subsystem 100. In this configuration, blower 120 can direct air across PCB 110 and/or GPU 112 more effectively than possible with conventional designs, as described in greater detail below in conjunction with FIG. 2.

Figure 2:
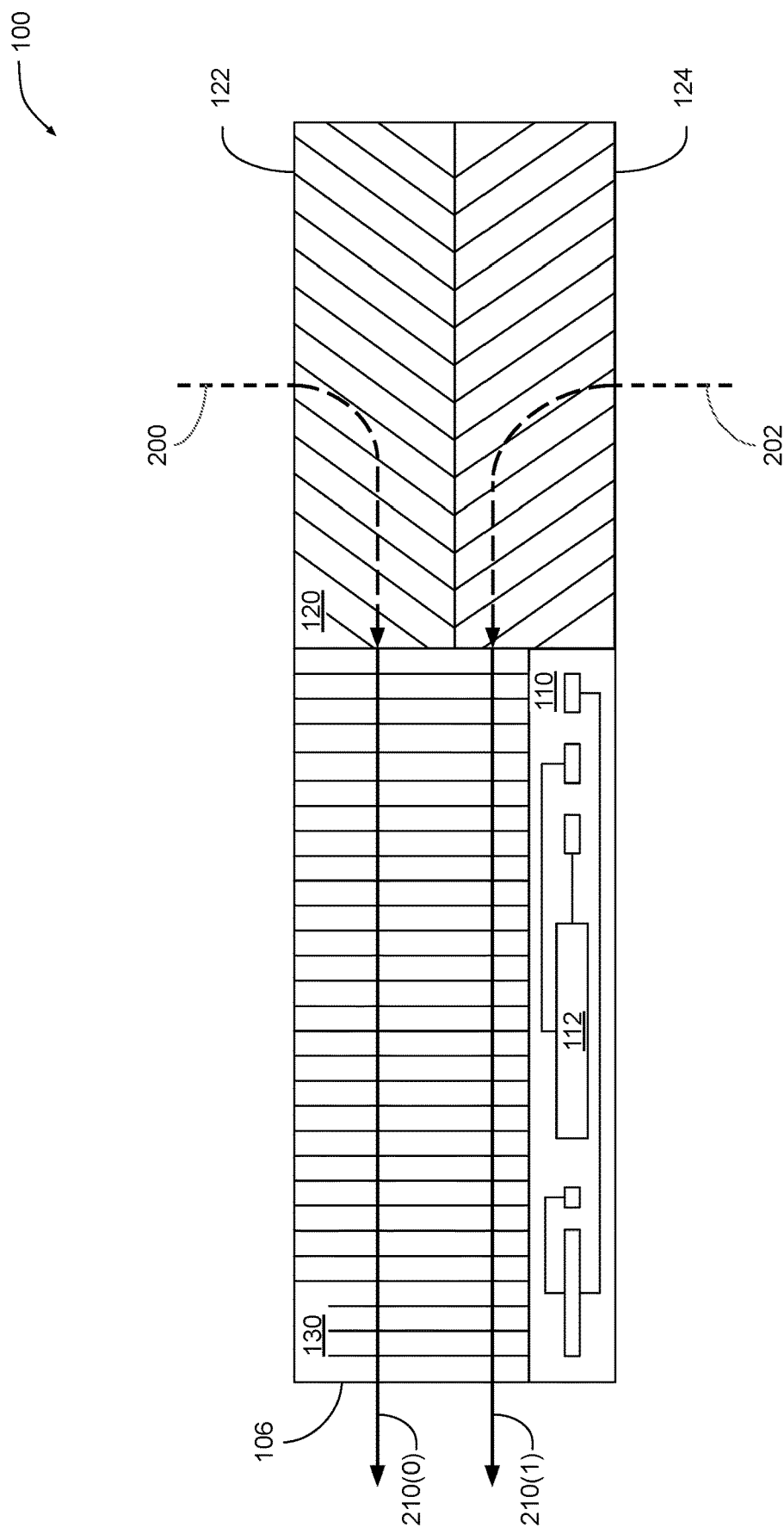
FIG. 2 illustrates how air flows within the graphics subsystem of FIG. 1, according to various embodiments.

FIG. 2 illustrates how air flows within the graphics subsystem of FIG. 1, according to various embodiments. As shown, during operation, blower 120 intakes air along airflow path 200 via inlet 122 and redirects that air through heat sink 130, along airflow path 210(0), towards outlet 106. Similarly, blower 120 intakes air along airflow path 202 via inlet 124 and redirects that air through heat sink 130, along airflow path 210(1), towards outlet 106.

Heat sink 130 extracts heat from PCB 110 and/or GPU 112 and transfers the extracted heat, via a heat transport mechanism, into air that traverses airflow paths 210(0) and 210(1). Subsequently, the heated air exits outlet 106, thereby removing heat from graphics subsystem 100. In one embodiment, PCB 110 may be disposed above bottom side 104 of graphics subsystem, thereby allowing blower 120 to direct air along both the top and bottom sides of PCB 110 towards outlet 106. In this configuration, graphics subsystem 100 may include a second heat sink disposed between PCB 110 and bottom side 102 of graphics subsystem 100.

One advantage of the disclosed design is that blower 120 can have a greater size than blowers found in conventional designs because PCB 110 is shortened to allow blower 120 to occupy the full height of graphics subsystem 100. Accordingly, the disclosed design can provide greater airflow and therefore greater convective cooling compared to conventional designs. Another advantage of the disclosed design is that because blower 120 occupies some or all of the full height of graphics subsystem 100, blower 120 can intake air from both sides of graphics subsystem 100, further increasing airflow and convective cooling. The performance of blower 120 is described in greater detail below in conjunction with FIG. 3.

Blower Performance Comparison

Figure 3:
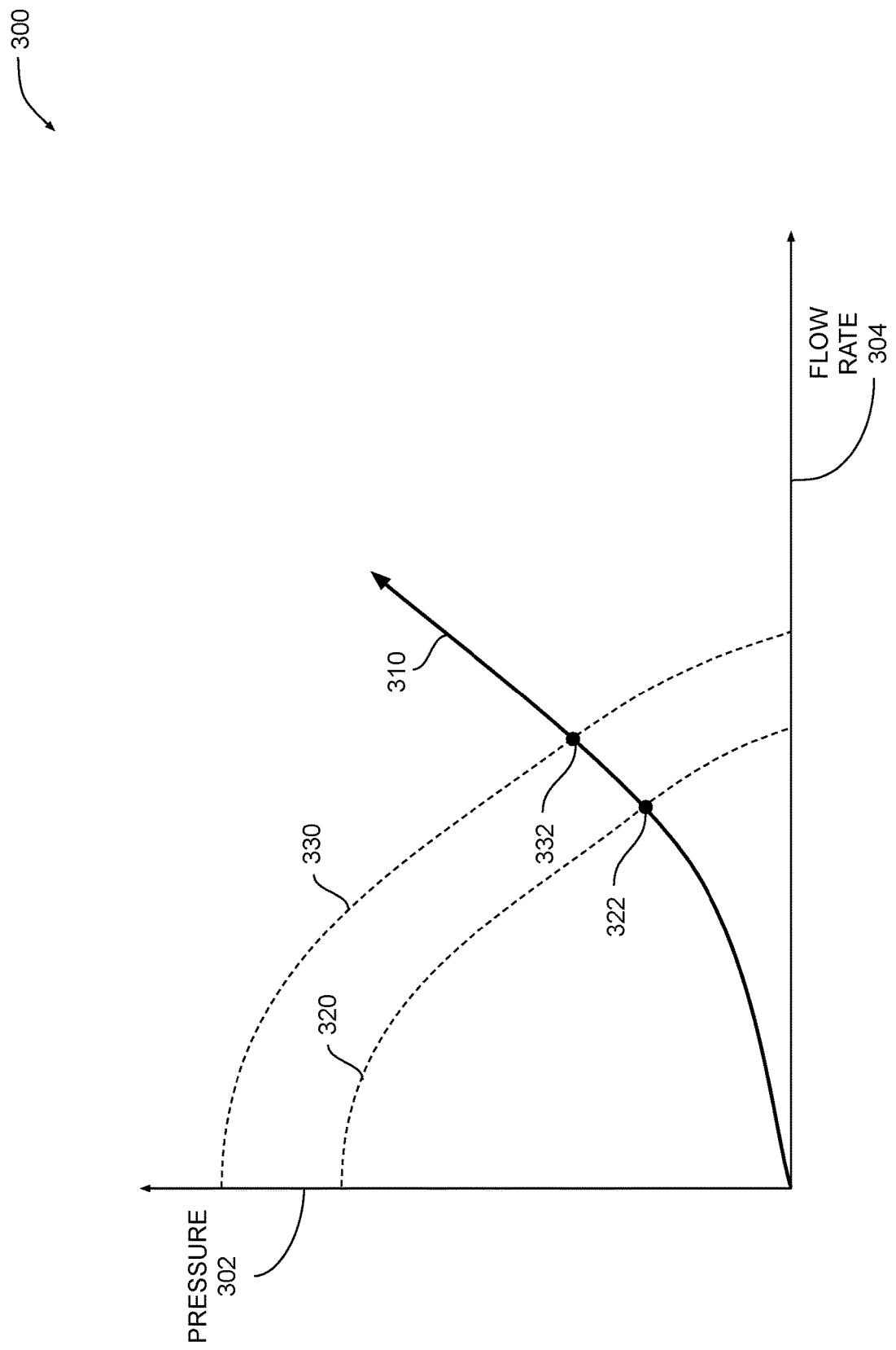
FIG. 3 is a graph of blower flow rate as a function of pressure, according to various embodiments.

FIG. 3 is a graph of flow rate as a function of pressure, according to various embodiments. As shown, a graph 300 plots pressure 302 as a function of flow rate 304.

Impedance curve 310 describes how variations in flow rate within graphics subsystem 100 cause changes in air pressure.

Performance curve 320 describes how the air pressure induced by a conventional blower changes with different flow rates. Operating point 322 represents the performance of the conventional fan when positioned within graphics subsystem 100. The conventional blower referred to in this example is generally smaller than blower 120 and includes only a single inlet. Performance curve 330 describes how the air pressure induced by blower 120 changes with different flow rates. Operating point 332 represents the performance of blower 120 when positioned within graphics subsystem 100 in the manner described above in conjunction with FIGS. 1-2. Compared to the conventional blower mentioned above, blower 120 is larger and may include two inlets, thereby allowing blower 120 to achieve the higher net flow rate associated with operating point 332 compared to operating point 322. Accordingly, blower 120 provides more effective convective cooling and therefore more effectively transports heat away from heat sink 130 compared to conventional blower designs.

Exemplary Implementations of a Graphics Subsystem

Figure 4:
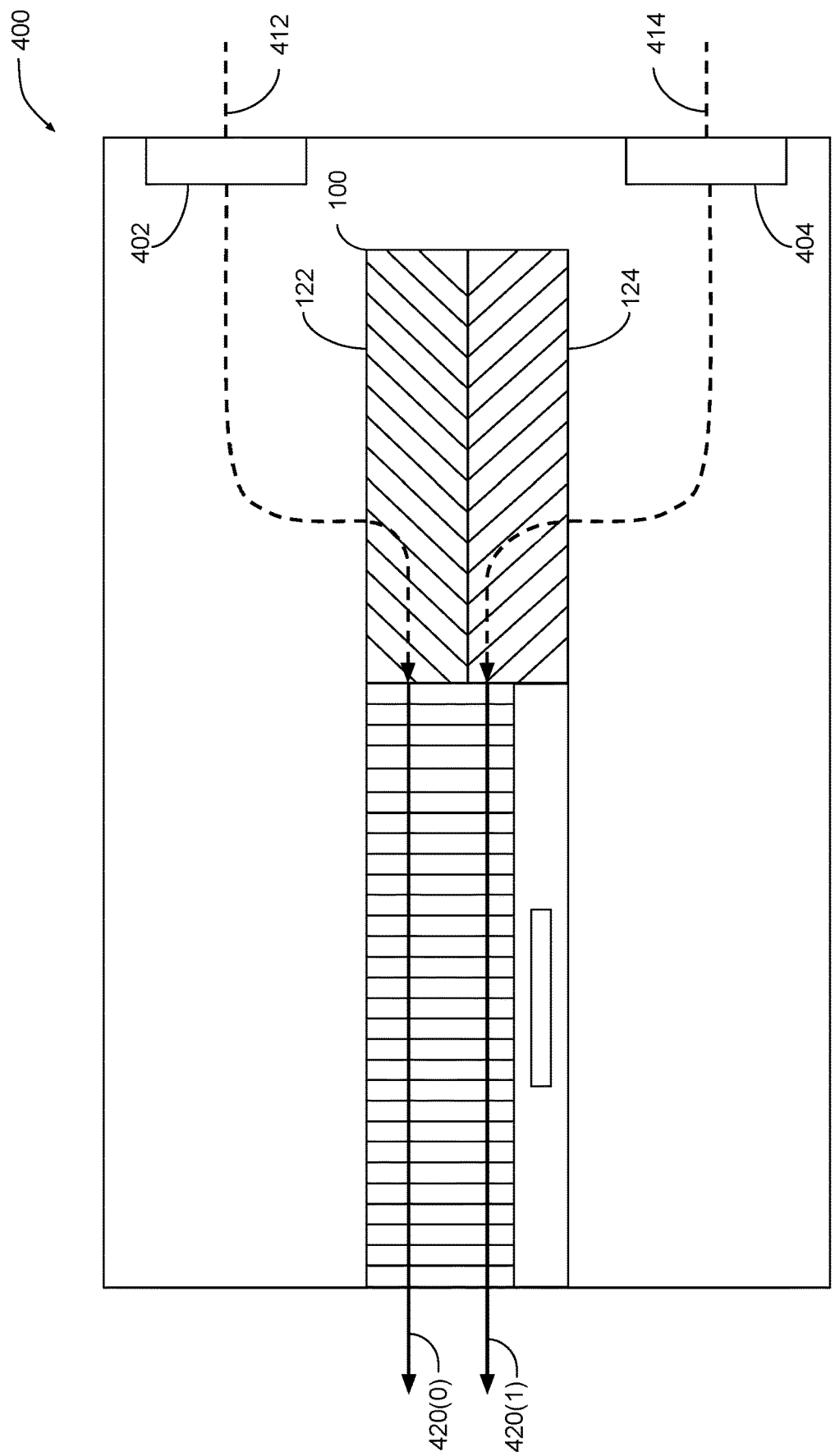
FIG. 4 illustrates a computer chassis that houses the graphics subsystem of FIG. 1, according to various embodiments.

FIG. 4 illustrates a computer chassis that houses the graphics subsystem of FIG. 1, according to various embodiments. As shown, computer chassis 400 includes graphics subsystem 100 and intake fans 402 and 404. In operation, intake fan 402 directs air along airflow path 412 to inlet 122 of blower 120. Blower 120 then redirects that air through heat sink 130, along airflow path 420(0), towards outlet 106. Similarly, intake fan 404 directs air along airflow path 414 to inlet 124 of blower 120. Blower 120 then redirects that air through heat sink 130, along airflow path 420(1), towards outlet 106. In this fashion, computer chassis 400 and graphics subsystem 100 interoperate to remove heat that is generated by PCB 110 and/or GPU 112.

Figure 5:
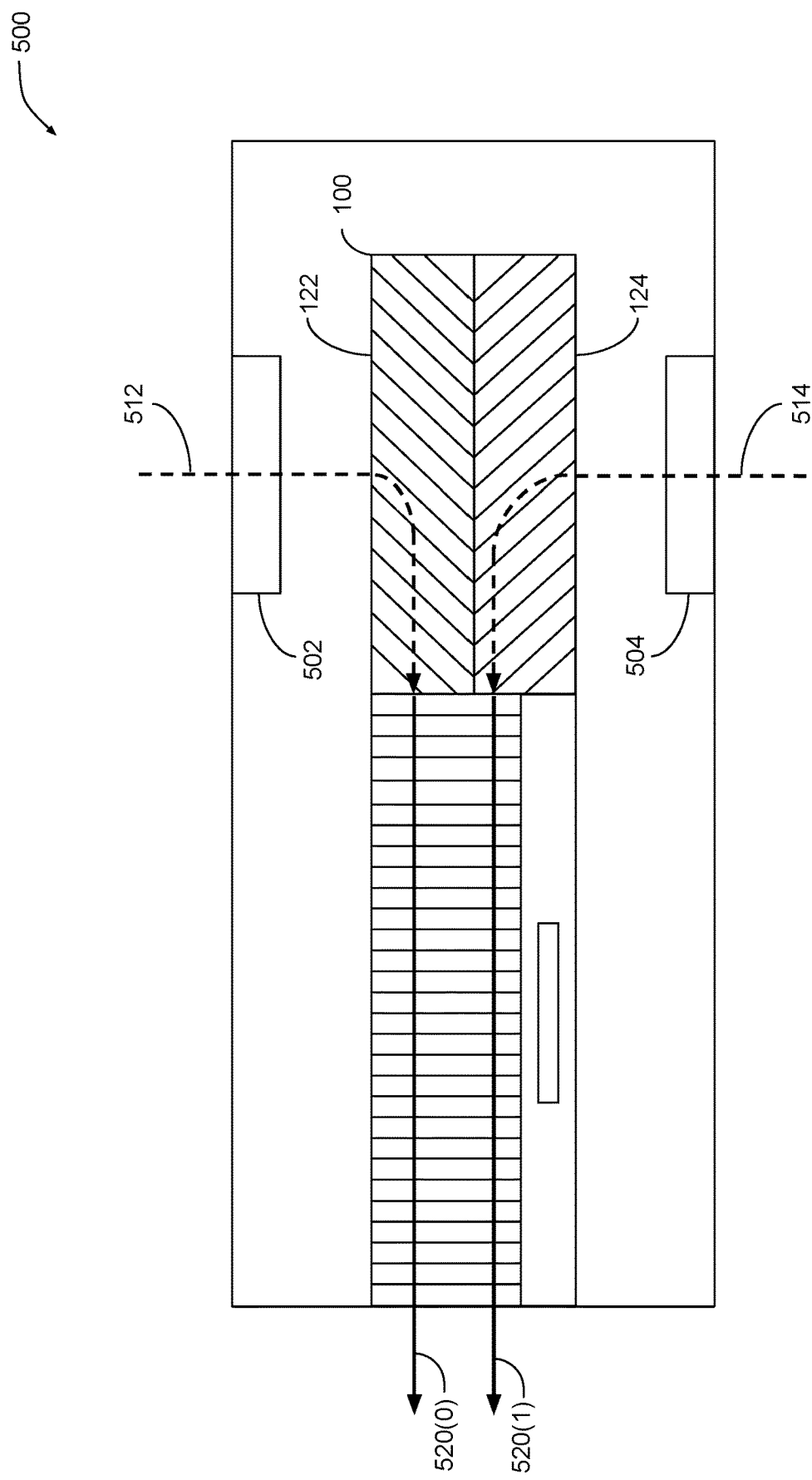
FIG. 5 illustrates another computer chassis that can house the graphics subsystem of FIG. 1, according to various other embodiments.

FIG. 5 illustrates another computer chassis that can house the graphics subsystem of FIG. 1, according to various other embodiments. As shown, computer chassis 500 includes graphics subsystem 100 and intake fans 502 and 504. In operation, intake fan 502 directs air along airflow path 512 to inlet 122 of blower 120, and blower 120 then redirects that air through heat sink 130, along airflow path 520(0), towards outlet 106. Similarly, intake fan 504 directs air along airflow path 514 to inlet 124 of blower 120, and blower 120 then redirects that air through heat sink 130, along airflow path 520(1), towards outlet 106. Similar to computer chassis 400, computer chassis 500 and graphics subsystem 100 interoperate to remove heat that is generated by PCB 110 and/or GPU 112. In one embodiment, computer chassis 500 may be configured to house a miniaturized computer system. For example, computer chassis 500 could be a mini-ITX type chassis.

Referring generally to FIGS. 4-5, graphics subsystem 100 may be implemented within any technically feasible type of computer chassis. Further, graphics subsystem 100 may be coupled to any technically feasible type of computing device. An exemplary computing device to which graphics subsystem 100 can be coupled is described below in conjunction with FIG. 6.

Figure 6:
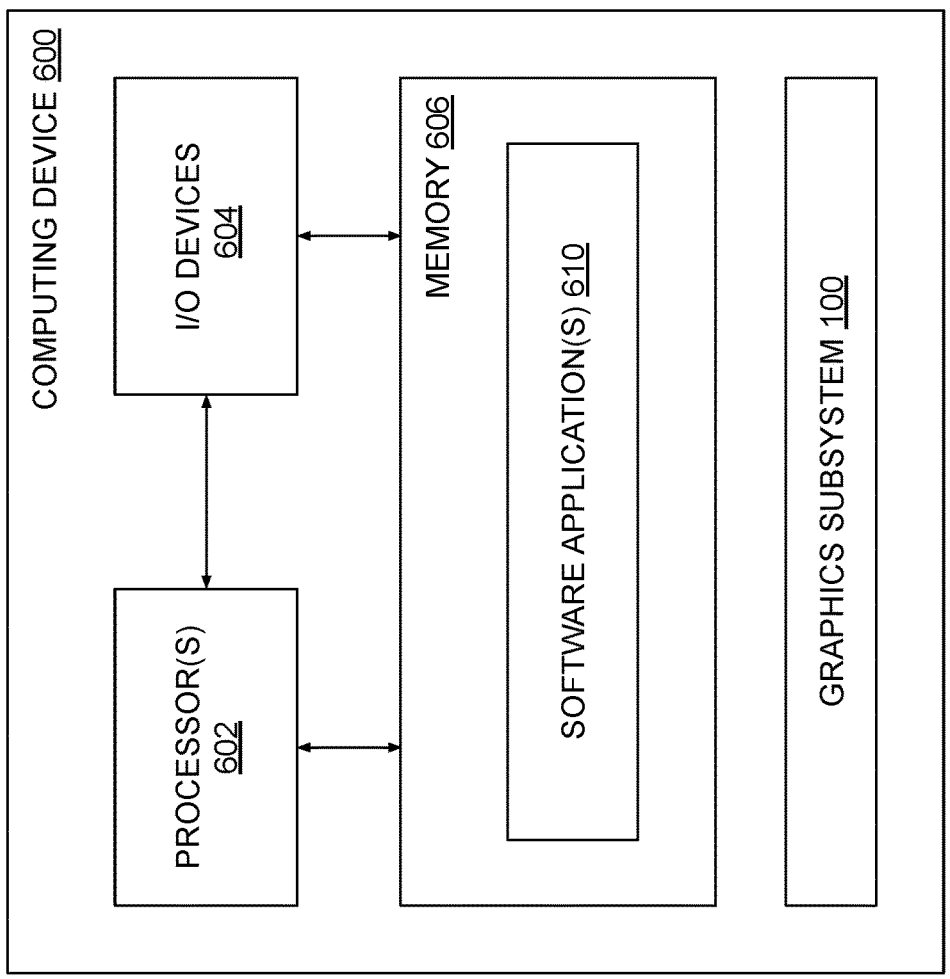
FIG. 6 illustrates an exemplary computing device that includes the graphics subsystem of FIG. 1, according to various embodiments.

FIG. 6 illustrates an exemplary computing device that includes the graphics subsystem of FIG. 1, according to various embodiments. As shown, computing device 600 includes one or more processors 602, input/output (I/O) devices 604, and a memory 606 that includes one or more software applications 610. Computing device 600 also includes graphics subsystem 100, which can be coupled to computing device 600 via a PCIe slot and interconnected with any of the other components of computing device 600 in any technically feasible manner. In various embodiments, graphics subsystem 100 may be coupled to computing device 600 via any technically feasible type of interface beyond those which comply with the PCIe standard. Processor 602 is configured to execute software application(s) 610 and to offload graphics processing operations associated with the software application(s) 610 to graphics subsystem 100 for processing via GPU 112. Graphics subsystem 100 returns processing results, such as rendered pixels, to computing device 600 for display via a display device that could reside, for example, within I/O devices 604. In various embodiments, computing device 600 may be implemented as a server computer (or virtualized instance thereof) and reside within a datacenter. As a general matter, graphics subsystem 100 can be implemented within any technically feasible type of computer system.

In sum, a graphics subsystem includes a PCB, a blower, and a heat sink. A GPU is integrated into the PCB. The PCB is shortened to occupy a smaller portion of the width of the graphics subsystem compared to the PCB within a conventional graphics subsystem. The heat sink is coupled to the PCB and/or the GPU and is configured to occupy a similarly smaller portion of the width of the graphics subsystem as the PCB.

The blower is disposed adjacent to one edge of the PCB and/or heat sink and extends axially between the top of the graphics subsystem and the bottom of the graphics subsystem. The blower includes a first inlet that intakes air from the top side of the graphics subsystem and then redirects that air across the PCB and/or heat sink towards an outlet disposed on one side of the graphics subsystem. The blower also includes a second inlet that intakes air from the bottom side of the graphics subsystem and then redirects that air across the PCB and/or heat sink towards the outlet. Because the PCB and heat sink do not occupy the entire width of the graphics subsystem, the blower can be sized to occupy a vertical span that extends the full height of the graphics subsystem. The disclosed configuration allows the blower to intake air from both the top and bottom sides of the graphics subsystem, thereby increasing flow rate and, thus, convective cooling capabilities.

At least one technical advantage of the disclosed design relative to the prior art is that, with the disclosed design, graphics subsystems can be equipped with higher performance GPUs relative to the GPUs typically included in conventional graphics subsystems. Accordingly, the disclosed design enables higher performance GPUs to be implemented in computer systems without a substantial risk of overheating. These technical advantages represent one or more technological advancements over prior art approaches.

1. Some embodiments include a system, comprising a printed circuit board on which a processor resides, and a blower that is coupled to the printed circuit board such that at least a portion of the blower abuts a first edge of the printed circuit board, and a first airflow path for cooling the processor is redirected through the blower and across the printed circuit board.

2. The system of clause 1, wherein the blower is coupled to opposing sides of the system.

3. The system of any of clauses 1-2, wherein both the system and the blower have a first height.

4. The system of any of clauses 1-3, further comprising a heat sink that is thermally coupled to the printed circuit board, wherein the blower has a first height, and the printed circuit board and the heat sink have a combined height equal to the first height.

5. The system of any of clauses 1-4, wherein the system has a first width, the printed circuit board has a second width, and the blower has a third width, and wherein the first width is equal to the sum of the second width and the third width.

6. The system of any of clauses 1-5, wherein the blower includes an axis of rotation that is disposed substantially perpendicular to the printed circuit board.

7. The system of any of clauses 1-6, wherein the blower includes an axis of rotation, and at least a portion of the axis of rotation is disposed substantially parallel to the first edge.

8. Some embodiments include a system, comprising a printed circuit board on which a processor resides, and a blower that is coupled to the printed circuit board, wherein a first airflow path for cooling the processor traverses through a first inlet and is redirected across the printed circuit board, and a second airflow path for cooling the processor traverses through a second inlet and is redirected across the printed circuit board.

9. The system of clause 8, wherein the first inlet is disposed on a first side of the system, and the second inlet is disposed on a second side of the system.

10. The system of any of clauses 8-9, wherein the first inlet and the second inlet are disposed on opposing sides of the system.

11. The system of any of clauses 8-10, wherein the first airflow path is redirected across a first side of the printed circuit board, and the second airflow path is redirected across a second side of the printed circuit board.

12. The system of any of clauses 8-11, wherein the first airflow path and the second airflow path are redirected across opposing sides of the printed circuit board.

13. The system of any of clauses 8-12, wherein at least a portion of the blower abuts a heat sink that is thermally coupled to the printed circuit board, and the first airflow path and the second airflow path are redirected across the printed circuit board and through the heat sink.

14. The system of any of clauses 8-13, wherein at least a portion of the blower abuts a first edge of the printed circuit board.

15. Some embodiments include a computing device, comprising a computer chassis that includes a printed circuit board on which a first processor resides, and a blower that is coupled to the printed circuit board such that at least a portion of the blower abuts a first edge of the printed circuit board, and a first airflow path for cooling the processor is redirected through the blower and across the printed circuit board.

16. The computing device of clause 15, further comprising a heat sink that is thermally coupled to the printed circuit board, wherein the first airflow path traverses from a first inlet to an outlet via the heat sink.

17. The computing device of any of clauses 15-16, further comprising a heat sink that is thermally coupled to the printed circuit board, wherein the blower has a first height, and the printed circuit board and the heat sink have a combined height equal to the first height.

18. The computing device of any of clauses 15-17, wherein the processor comprises a graphics processing unit or a central processing unit that generates heat when performing processing operations, and the blower dissipates at least a portion of the heat via the first airflow path.

19. The computing device of any of clauses 15-18, wherein the blower causes the first airflow path to traverse through a heat sink that includes a plurality of cooling fins to an environment external to the computer chassis.

20. The computing device of any of clauses 15-19, wherein the blower causes the first airflow path to traverse through a heat sink that includes a plurality of heat pipes to an environment external to the computer chassis.

Any and all combinations of any of the claim elements recited in any of the claims and/or any elements described in this application, in any fashion, fall within the contemplated scope of the present embodiments and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A subsystem, comprising:
 a printed circuit board, wherein a processor and a heat sink reside on a top surface of the printed circuit board, and the processor is thermally coupled to the heat sink; and
 a blower that is coupled to the printed circuit board such that the blower is adjacent to a first edge of the printed circuit board and does not overlap with any portion of the top surface of the printed circuit board, wherein a first airflow path for cooling the processor is redirected through the blower and across the top surface of the printed circuit board, and a second airflow path for cooling the processor is redirected through the blower and across the top surface of the printed circuit board, wherein the second airflow path is different from the first airflow path
 wherein the subsystem has a first height and is adapted to be connected to a motherboard of a computing device via a first interface slot that has a first form factor, wherein the printed circuit board and the heat sink have a combined height, and wherein the first height is approximately equal to both a height of the blower and the combined height.

2. The subsystem of claim 1, wherein the blower defines a top of the subsystem and a bottom of the subsystem.

3. The subsystem of claim 1, wherein the subsystem has a first width, the printed circuit board defines an edge of the subsystem and has a second width that is less than the first width, and the blower occupies a remaining width of the subsystem next to the printed circuit board and occupies the first height of the subsystem.

4. The subsystem of claim 1, wherein the blower includes an axis of rotation that is disposed substantially perpendicular to the printed circuit board.

5. The subsystem of claim 1, wherein the blower includes an axis of rotation, and at least a portion of the axis of rotation is disposed substantially parallel to the first edge.

6. A subsystem, comprising:
 a printed circuit board, wherein a processor and a heat sink reside on a top surface of the printed circuit board, and the processor is thermally coupled to the heat sink; and
 a blower that is coupled to the printed circuit board such that the blower is adjacent to a first edge of the printed circuit board and does not overlap with any portion of the top surface of the printed circuit board, wherein a first airflow path for cooling the processor traverses through a first inlet and is redirected across the top surface of the printed circuit board, and a second airflow path for cooling the processor traverses through a second inlet and is redirected across the top surface of the printed circuit board,
 wherein the subsystem has a first height and is adapted to be connected to a motherboard of a computing device via a first interface slot that has a first form factor, wherein the printed circuit board and the heat sink have a combined height, and wherein the first height is approximately equal to both a height of the blower and the combined height.

7. The subsystem of claim 6, wherein the first inlet is disposed on a first side of the subsystem, and the second inlet is disposed on a second side of the subsystem.

8. The subsystem of claim 6, wherein the first inlet and the second inlet are disposed on opposing sides of the subsystem.

9. The subsystem of claim 6, wherein the first airflow path is redirected across a first side of the printed circuit board, and the second airflow path is redirected across the first side of the printed circuit board.

10. The subsystem of claim 6, wherein the first airflow path and the second airflow path are redirected, at least in part, in opposite directions and subsequently across the top surface of the printed circuit board.

11. The subsystem of claim 6, wherein at least a portion of the blower abuts the heat sink that is thermally coupled to the printed circuit board, and the first airflow path and the second airflow path are redirected across the top surface of the printed circuit board and through the heat sink.

12. A computing device, comprising:
 a computer chassis that includes a subsystem comprising:
  a printed circuit board, wherein a processor and a heat sink reside on a top surface of the printed circuit board, and the processor is thermally coupled to the heat sink, and
  a blower that is coupled to the printed circuit board such that the blower is adjacent to a first edge of the printed circuit board and does not overlap with any portion of the top surface of the printed circuit board, wherein a first airflow path for cooling the processor traverses through a first inlet and is redirected through the blower and across the top surface of the printed circuit board, and a second airflow path for cooling the processor traverses through a second inlet and is redirected through the blower and across the top surface of the printed circuit board
  wherein the subsystem has a first height and is adapted to be connected to a motherboard of the computing device via a first interface slot that has a first form factor, wherein the printed circuit board and the heat sink have a combined height, and wherein the first height is approximately equal to both a height of the blower and the combined height.

13. The computing device of claim 12, wherein the first airflow path traverses from the first inlet to an outlet via the heat sink.

14. The computing device of claim 12, wherein the processor comprises a graphics processing unit or a central processing unit that generates heat when performing processing operations, and the blower dissipates at least a portion of the heat via the first airflow path.

15. The computing device of claim 12, wherein the blower causes the first airflow path to traverse through the heat sink to an environment external to the computer chassis.

16. The computing device of claim 12, wherein the blower causes the second airflow path to traverse through the heat sink to an environment external to the computer chassis.

* * * * *